(12) United States Patent
Goodwin

(10) Patent No.: US 10,488,228 B2
(45) Date of Patent: Nov. 26, 2019

(54) TRANSPARENT-BLOCK ENCODER HEAD WITH ISOTROPIC WEDGED ELEMENTS

(71) Applicant: NIKON CORPORATION, Tokyo (JP)

(72) Inventor: Eric Peter Goodwin, Oro Valley, AZ (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/866,696

(22) Filed: Jan. 10, 2018

(65) Prior Publication Data

US 2018/0128653 A1    May 10, 2018

Related U.S. Application Data

(63) Continuation-in-part of application No. 15/800,480, filed on Nov. 1, 2017, and a continuation-in-part of
(Continued)

(51) Int. Cl.
| | |
|---|---|
| *G01D 5/26* | (2006.01) |
| *G01D 5/38* | (2006.01) |
| *G03F 7/20* | (2006.01) |
| *G01D 5/347* | (2006.01) |
| *H01L 21/68* | (2006.01) |

(52) U.S. Cl.
CPC ......... *G01D 5/266* (2013.01); *G01D 5/34715* (2013.01); *G01D 5/38* (2013.01); *G03F 7/70775* (2013.01); *H01L 21/681* (2013.01)

(58) Field of Classification Search
None
See application file for complete search history.

(56) References Cited

U.S. PATENT DOCUMENTS

| | | | | |
|---|---|---|---|---|
| 5,973,864 A | * | 10/1999 | Lehmann | G01J 3/42 359/834 |
| 6,020,964 A | * | 2/2000 | Loopstra | G03F 7/70775 356/401 |

(Continued)

*Primary Examiner* — Shawn Decenzo
(74) *Attorney, Agent, or Firm* — Yakov Sidorin; Quarles & Brady LLP

(57) ABSTRACT

An encoder head configured for use with a lithographic exposure tool. The head is devoid of a multiplicity of stand-alone optical retroreflectors. The head includes a single, geometrically substantially perfect optically-isotropic cuboid complemented with optically-isotropic prismatic elements to form a contraption that, in combination with a diffraction grating disposed on a wafer-stage of the exposure tool, splits a single input beam of light delivered to the contraption into four measurement (sub-)beams of light (two in xz-plane, two in yz-plane) and causes each of these sub-beams traverse two prismatic elements and be retro-reflected internally within the cuboid to exit the encoder head at a non-zero angle with respect to the input beam of light, thereby solving problems of (i) structural complexity of a conventional encoder head for use in an exposure tool, (ii) burdensome alignment of the multitude of optical prisms in the process of forming such encoder head, and (iii) cyclic non-linear errors associated with measurements involving conventional corner-cubes-based encoder heads while, at the same time, reducing the geometrical footprint of the encoder head (without reducing the cross-section of the single input beam).

33 Claims, 8 Drawing Sheets

Related U.S. Application Data application No. 15/483,887, filed on Apr. 10, 2017, now Pat. No. 10,162,087.

(60) Provisional application No. 62/445,317, filed on Jan. 12, 2017, provisional application No. 62/416,847, filed on Nov. 3, 2016, provisional application No. 62/320,985, filed on Apr. 11, 2016.

(56) References Cited

U.S. PATENT DOCUMENTS

| | | | |
|---|---|---|---|
| 7,023,610 B2 | 4/2006 | Ohtsuki et al. | |
| 8,995,814 B2 * | 3/2015 | Deshazer | G02B 1/045 385/141 |
| 9,201,313 B2 | 12/2015 | Liesener | |
| 9,746,348 B2 * | 8/2017 | de Groot | G01D 5/266 |
| 2010/0297561 A1 * | 11/2010 | Beerens | G03F 7/70775 430/322 |
| 2012/0092669 A1 * | 4/2012 | Fiolka | G01M 11/0257 356/365 |
| 2012/0194824 A1 * | 8/2012 | de Groot | G01B 9/02003 356/482 |
| 2012/0320380 A1 * | 12/2012 | Schonleber | G01B 11/0625 356/479 |
| 2013/0048842 A1 * | 2/2013 | Goodwin | G01D 5/34723 250/231.1 |
| 2013/0050829 A1 * | 2/2013 | Efimov | G02B 27/1093 359/569 |
| 2013/0114062 A1 * | 5/2013 | Liesener | G01D 5/38 355/72 |
| 2013/0128255 A1 | 5/2013 | Liu | |
| 2013/0330662 A1 * | 12/2013 | Goodwin | G01J 1/42 430/30 |
| 2014/0049762 A1 | 2/2014 | Goodwin | |
| 2015/0185617 A1 * | 7/2015 | Markle | G03F 7/2051 430/269 |
| 2015/0276385 A1 | 10/2015 | Goodwin et al. | |
| 2016/0102999 A1 * | 4/2016 | Liesener | G01D 5/266 356/488 |
| 2017/0097574 A1 * | 4/2017 | Goodwin | G03F 7/70141 |
| 2017/0292860 A1 | 10/2017 | Goodwin et al. | |
| 2018/0017781 A1 * | 1/2018 | Markle | G02B 26/0833 |
| 2018/0024448 A1 * | 1/2018 | Tung | G03F 7/70275 355/56 |

* cited by examiner

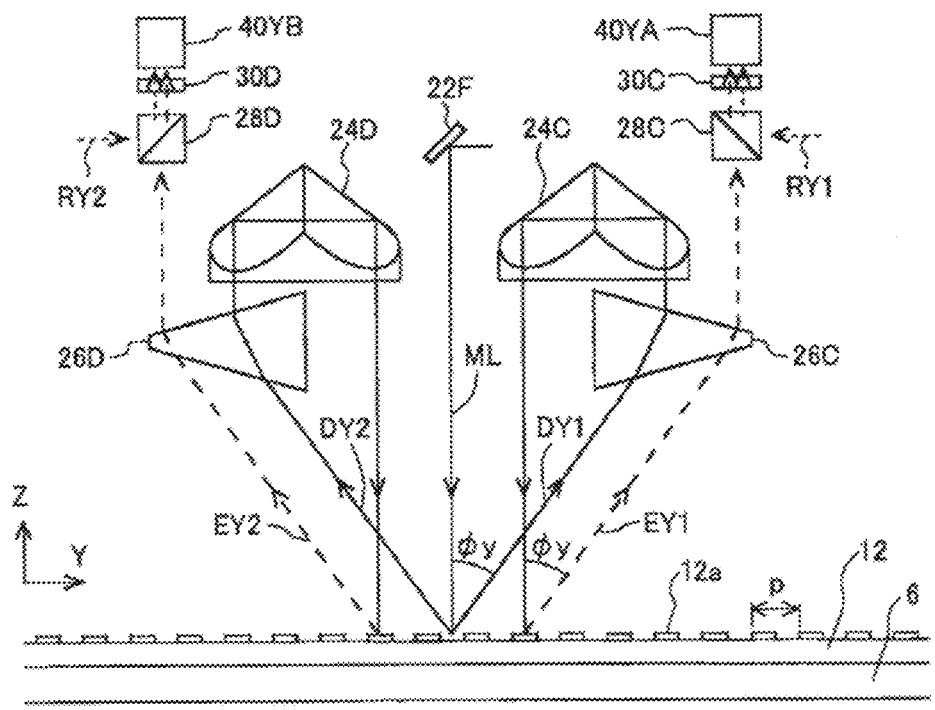
FIG. 2A (PRIOR ART)
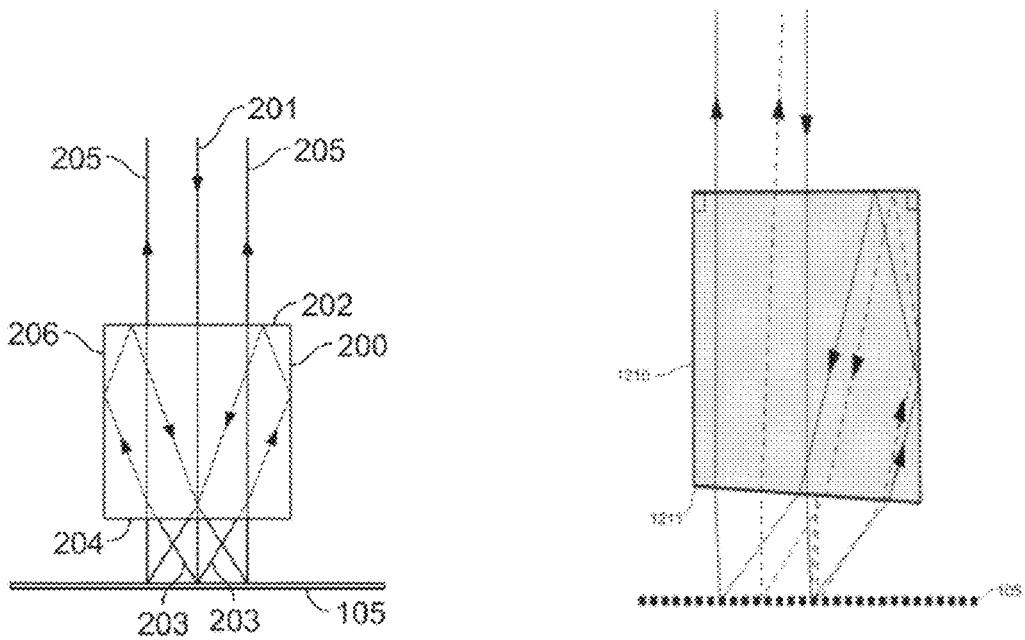
FIG. 2B (PRIOR ART)
FIG. 2C (PRIOR ART)

TRANSPARENT-BLOCK ENCODER HEAD WITH ISOTROPIC WEDGED ELEMENTS

CROSS-REFERENCE TO RELATED APPLICATIONS

The present application claims priority from and benefit of the U.S. Provisional Patent Application No. 62/445,317 filed on Jan. 12, 2017.

The present application is a continuation-in-part from the U.S. patent application Ser. No. 15/483,887, filed on Apr. 10, 2017, and now published as US 2017/0292860, which in turn claims priority from the U.S. Provisional Patent Application No. 62/320,985 filed on Apr. 11, 2016. The present application is also a continuation-in-part from the U.S. patent application Ser. No. 15/800,480, filed on Nov. 1, 2017, which in turn claims priority from the U.S. Provisional Patent Application No. 62/416,847 filed on Nov. 3, 2016. The disclosure of each of the above-identified patent applications is incorporated herein by reference.

BACKGROUND

Lithographic exposure apparatus (or exposure tools, for short) are commonly used to transfer images from a reticle onto a semiconductor wafer during semiconductor processing. A typical exposure apparatus, used for transfer of a pattern from a reticle onto a substrate of interest (interchangeably—a target substrate or a wafer, such as a semiconductor wafer during the semiconductor processing) includes an illumination source, a reticle stage assembly (that positions a reticle within the apparatus), an optical assembly containing the so-called projection optics, and a wafer stage assembly (that positions the target substrate or a wafer). The exposure apparatus also includes a measurement system (that monitors positions of the reticle and the target substrate) that employs an encoder head, and a control system that governs operations of various assemblies to adjust, when required, mutual positioning of the reticle and the target substrate. The geometrical features of patterns transferred from the reticle onto the target substrate are extremely small, which imposes extremely tight requirements on precise positioning of the target substrate and the reticle to manufacture high quality patterned semiconductor wafers.

Accuracy of the measurement system employed by the exposure apparatus constantly requires improvement (which is partly driven by advances in design of an exposure tool), while relatively small size, simplicity of construction, a need for reduced number of moving parts and high sensitivity remain as practical limitations.

SUMMARY

Embodiments provide an optical system configured to reflect an input beam of light to form a reflected beam of light. The optical system includes a combination of (i) an optically-isotropic block having rectangular facets (among which are an input facet, and output facet opposite to the input facet, and multiple side facets connecting the input and output facets), and (ii) an optically-isotropic optical wedge element disposed along the output facet such as to not intersect an axis of symmetry of said input facet. The optical system further includes an optical surface disposed to redirect a portion of the input beam, which has entered said block through the input facet and traversed the block and the optical wedge element towards the combination. Here, the input facet forms a right dihedral angle with each of the side facets and each of the side facets forms a right dihedral angle with each of neighboring side facets.

Embodiments further provide an encoder head configured for use in a lithographic exposure tool that includes a wafer-stage carrying a diffraction grating, the encoder head comprising a measurement arm including an optically-isotropic cuboid and at least one optically-isotropic wedge element that is disposed between the cuboid and the diffraction grating and aside from an axis of symmetry of said optical block. Here, the measurement arm is configured to return a measurement beam, delivered to the measurement arm along a first axis, along a second axis that is inclined at a non-zero angle with respect to the first axis.

Embodiments further provide an encoder system that includes a diffraction grating; and an encoder head. The encoder head contains a single cuboid of optically-isotropic material disposed to transmit an input beam of light, delivered along a first axis, towards the diffraction grating; and plurality of optically-isotropic wedges between said cuboid and said diffraction grating.

The encoder head is configured to form, from the input beam, a plurality of measurement beams each of which diffracts at the grating twice and is transmitted through first and second wedges of the plurality of optically-isotropic wedges. In a specific implementation, none of the multiple optically-isotropic wedges intersects the axis of symmetry of said cuboid. The encoder head is further configured to form, from the input beam, reference beams and combine each of such reference beams with a corresponding measurement beam from the plurality of measurement beams to form a plurality of output beams each of which is directed along a second axis, wherein the second axis is not parallel to the first axis.

Furthermore, the embodiments provide a method for determining a position of a target placed in a lithographic exposure tool. The method includes (i) transmitting a first portion of light, delivered to the encoder head of the exposure tool, along a first axis through top and bottom surfaces of an optically-isotropic cuboid of the encoder head towards a diffraction grating to form an input measurement beam of light; and (ii) diffracting light from the input measurement beam of light twice at the diffraction grating to form a first output measurement beam of light transmitted, through the bottom and top surfaces, along a first output axis that is inclined with respect to the first axis at a non-zero angle.

A person of skill in the art will appreciate, therefore, that embodiments discussed below simultaneously address a group of inter-related existing operational limitations. In particular, embodiments address the goals of achieving cyclic-non-linear-error-free measurement signals, the structural simplification and the reduction of the number of optical components of the encoder head, and the reduction of the overall encoder-head package size, to name just a few, by configuring an embodiment of the encoder head around the combination of a single, sole optically-isotropic block retroreflector with an optically-isotropic wedge.

BRIEF DESCRIPTION OF THE DRAWINGS

The invention will be more fully understood by referring to the following Detailed Description of Specific Embodiments in conjunction with the not-to scale Drawings, of which:

FIG. 2A is a schematic diagram of a portion or component of an encoder head of related art that utilizes multiple individual corner-cube retroreflectors and other stand-alone prismatic elements;

FIGS. 2B and 2C provide schematic diagrams of portions, of an encoder head of related art, each of which utilizes a monolithic optical component with the corners configured to operate as conventional retro-reflectors for light propagating internally through such optical component;

FIG. 5A: propagation of +1 diffraction order formed in xz-plane; FIG. 5B: propagation of +1 diffraction order formed in yz-plane;

Figure 1:
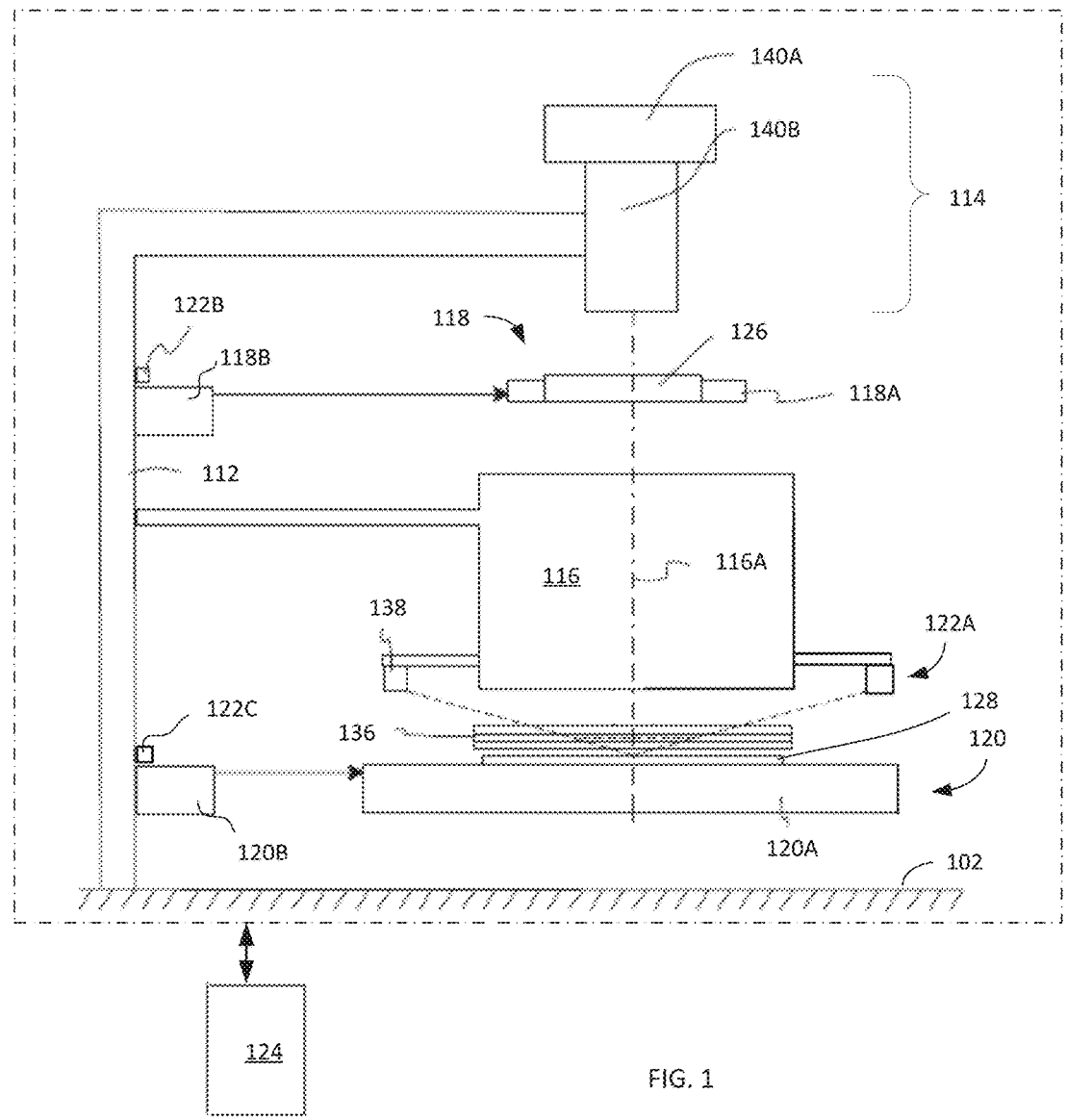
FIG. 1 is a diagram schematically illustrating a lithographic exposure apparatus.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

While the use of lens elements at the very input and output of the system (for collimation incoming beam(s) of light that are sometimes more than one, and for coupling of light at the output of the encoder head into output fibers) may be the decided upon way to effectuate the light-input and light-output delivery steps to and from the encoder head(s), the very kernel of the encoder heads of the related art is devised and structured around the use of either multiple individual, stand-alone prismatic elements that include multiple corner retro-reflectors (see, for example, US 2013/0128255, US 2015/0276385, US 2014/0049762, to name just a few, the disclosure of each of the above-mentioned patent documents is incorporated by reference herein) or, alternatively, around an optical component referred to as monolithic the propagation of light inside of which includes retro-reflection of light at the corners of such monolithic optical component (with each of the corners representing, for internally propagating light, just another corner retroreflector, see for example U.S. Pat. No. 9,201,313). As understood in the art, a retroreflector (sometimes referred to as a cataphote) is a device or surface that reflects light back to its source, back along a vector that is parallel to but opposite in direction with respect to the vector along which the light arrived at the retroreflector from the source of light.

As appreciated by a skilled artisan and further discussed below, a design of either encoder head—the one that employs several independent, spatially-distinct corner-cube prismatic retro-reflectors, or the one that combines such corner retroreflectors in one monolithic optical component—necessarily imposes operational shortcomings on the overall encoder-head structure. Among such operational shortcomings there are large number of constituent elements/parts, structurally complex input-output optical assemblies and/or a limited size/cross-section of the optical beam reaching a diffraction grating of the encoder head (the latter immediately translating into the smaller number of grating lines or grooves available for averaging of optical information) and the operational coupling of the sampling of a section of the diffraction grating with measurement beams on the z-position of the grating (that is, a position of the grating along an optical axis of the encoder head).

Co-assigned U.S. provisional patent applications 62/320,985 and 62/416,847 offer examples of implementations of a light-processing portion of the optical system of the encoder head that alleviate the above-identified shortcomings by reducing the operation of the encoder head from being dependent on the use of the prism elements. The offered solutions turn on the employment of a single, sole, optically-isotropic optical block configured to implement such an act of reflection in the optical encoder head in which the internal reflection of light inside the optical block cannot qualify as retro-reflection. Specifically, the single optical block (in one example—a cuboid, as described in U.S. Provisional Patent Application No. 62/320,985) has geometry that is intentionally frustrated, in comparison with a conventional cube, by having at least one side facet of the cuboid (that is, the facet transverse to a facet through which light enters the cuboid) be turned or tilted such as to intentionally deviate the geometry of cuboid's corner formed with assistance of such side facet from that of a retro-reflecting corner, to make such corner be devoid of retro-reflective combinations of optical surfaces, and, as a result, to disqualify the reflection of light occurring internally at such corner from producing the beam that returns, inside the optical block, along an axis that is parallel to the axis the light arrived towards such corner. In a related solution, discussed in 62/416,847, a single, solid, optically-isotropic optical block is used in conjunction with additional birefringent optical components, as described in 62/416,847). The resulting optical heads, at the end, are configured to form and utilize the measurement (sub-) beams of light that either (i) interact with different, not overlapping with one another areas of a diffraction grating carried by a wafer-stage of the exposure tool (such as measurement beams of light that diffract at or, as termed in Ser. 62/320,985, "pass by" the grating twice, at spatially distinct and different from one another areas of the wafer-stage grating) or, alternatively, (ii) interact with the same area of the wafer-stage diffraction grating (see 62/416,847).

The embodiments discussed herein provide alternative implementations of a light-processing portion of the optical system of the encoder head that is freed from the conventional use of multiple corner-cube retroreflectors, thereby making the light-encoding operation of the exposure tool robust and less susceptible to errors.

Typical Exposure Apparatus and Encoder Head Equipped with Individual Corner-Cube Reflectors.

To appreciate the context and operational environment in which an embodiment of the proposed encoder head(s) may be used, a general description of a typical lithographic exposure apparatus may be useful. An example of the exposure apparatus (also interchangeably referred to as a lithographic apparatus), which may employ a conventional encoder head—the one equipped with individual corner cube retroreflectors—as well as, optionally, an autofocus system (AFS) for measurements of wafer displacements is provided in PCT/US2012/043186, which is incorporated herein by reference. FIG. 1 schematically illustrates, in reference to the provided Cartesian system of coordinates, a schematic illustration of such exposure apparatus.

The exposure apparatus 100 includes an apparatus frame 112, an illumination system 114 (also referred to as irradiation apparatus), an optical assembly 116, a reticle stage assembly 118, a wafer stage assembly 120, a positioning system (shown as a combination of several units including systems 122A, 122B, 122C), and a control system 124. The design of the components of the exposure apparatus 100 can be varied to suit specific requirements. The exposure apparatus 100 may be mounted to/on a mounting base 102, such as the ground, a base, or floor, or some other supporting structure.

Apparatus Frame.

The apparatus frame 112 is rigid and supports and/or houses at least the reticle stage assembly 118, the optical assembly 116, the wafer stage assembly 120, and the illumination system 114 above the mounting base 102.

Illumination System.

The illumination system 114 includes an illumination source 140A and an illumination optical assembly 140B. The illumination source 140A emits radiation to which the wafer/work-piece 128 is exposed and which is guided by the illumination optics of the assembly 140B to the optical assembly 116, along an optical axis 116A. On its way to the optical assembly 116, the beam of radiation illuminates a portion of the reticle 126 to gain spatial pattern of irradiation representing the pattern of the reticle 126.

The illumination source 140A can be, for example, any of a g-line source (436 nm), an i-line source (365 nm), a KrF excimer laser (248 nm), an ArF excimer laser (193 nm), a F2 laser (157 nm), or an EUV source (13.5 nm). The wafer-illuminating (exposure) light may be provided at about 193 nm (by an ArF excimer laser system, for example) light (with a wavelength of 193 nm), but it can also include ultraviolet light such as described in, for example, U.S. Pat. No. 7,023,610. The source 140A of illuminating light may exploit harmonic frequency conversion or utilize an optical-fiber based amplifier, to produce radiation at a predetermined wavelength. Alternatively, the illumination source 140A can generate charged particle beams such as an x-ray or an electron beam. For instance, in the case where an electron beam is used, thermionic emission type lanthanum hexaboride (LaB6) or tantalum (Ta) can be used as a cathode for an electron gun. Furthermore, in the case where an electron beam is used, the structure could be such that either a mask is used or a pattern can be directly formed on a substrate without the use of a mask.

Optical Assembly.

The optical assembly 116 projects and/or focuses the light passing through the reticle 126 onto the work piece (wafer) 128. Depending upon the design of the exposure apparatus 100, the optical assembly 116 can scale (i.e., to magnify or reduce, with a specific coefficient) dimensions of the pattern of the reticle 126. In a specific implementation, the optical assembly 126 may simply relay the pattern of the reticle 126 onto the wafer (i.e., have a unit magnification).

Reticle Stage Assembly.

The reticle stage assembly 118 holds and positions, (with the use of a reticle stage mover assembly 118B) the reticle stage 118A that retains the reticle 126 relative to the optical assembly 116 and the wafer 128. The reticle stage mover assembly 118B can be designed to move the reticle stage 118A along any of the x, y, z axes.

Wafer Stage Assembly.

The wafer stage assembly 120 holds and positions (with the use of a wafer stage mover 120B) the wafer 128 with respect to the image of the illuminated portion of the reticle 126 projected onto the wafer. The wafer stage mover 120B can be designed to move the wafer 128 along any of the x, y, z axis. In one embodiment, the wafer 128 can be scanned while the wafer stage assembly 120 moves the wafer 128 along the y-axis.

Positioning System.

The positioning system (122A, 122B, 122C) monitors movement of the reticle 126 and the wafer 128 relative to the optical assembly 116 or some other reference. As shown in FIG. 1, the position system 122 includes (i) an AFS 122A that maps the topography of the wafer 128 relative to the optical assembly 116 along the Z axis (which is collinear with the optical axis 116A), about the X axis, and about the Y axis prior to exposure of the wafer with improved accuracy; (ii) a reticle measurement system 122B (only a portion of which is illustrated) that monitors the position of the reticle stage 118A and the reticle 126; and (iii) a wafer measurement system 122C (only a portion of which is illustrated) that monitors the position of the wafer stage 120A along the X and Y axes, and about the Z axis. Due to operation of the position system, the wafer stage assembly 120 can be controlled to position the wafer 128 with improved accuracy. The positioning system 122 can utilize laser interferometers, encoders, autofocus systems, and/or other measuring devices.

One implementation the autofocus system 122A includes a reference system 136 providing a reference signal used in conjunction with and related to the measurement of any changing operational parameter of the AFS 122A but not the position of the wafer 128 along the optical axis 116A. The AFS 122A further includes a measurement system 138, which provides a measurement signal used in conjunction with and related to the measurement of anything changing in the AFS 22A including (the change of, if present,) position of the wafer 128 along the optical axis 116A. By comparing the reference and measurement signals, the position of the wafer 128 is measured, which is accompanied with reduction of the stability requirements for many of the components of the AFS 122A.

A typical measurement system 138 may include an encoder assembly (not shown) that measures, in operation, the position of a work piece (as shown—the wafer 128). For example, in some embodiments, the encoder assembly can be designed to monitor and/or measure the position of the work piece along two axes (e.g., along the x- and y-axes). Additionally and/or alternatively, the encoder assembly can be designed to measure and/or monitor the position of the work piece 128 along all three axes (i.e., to specify the 3D position of the work piece 228).

The conventional measurement system 138 may also include a stage grating (not shown) that is secured to a side of the wafer stage 120A (of the assembly 120) that retains the work piece 128, and one or more fixed encoder heads (not shown). The number of encoder heads and their mutual positioning and orientation can be varied according to the design of the exposure apparatus 100 and/or the measurement system 138, and the amount of travel of the stage 120A along x- and y-axes. The use of multiple encoder heads enables the encoder assembly to more accurately measure the position of the stage 120A, and thus the position of the work piece 128 that is retained by the stage 120A. Examples of the structure(s) of the measurement system 138 and encoder head(s) are discussed in detail in U.S. 2014/0049762, which is incorporated herein by reference, and will not be addressed here additionally.

Control System.

The control system 124 is operably connected to and governs the operation of at least the illumination system 114, the reticle stage assembly 118, the wafer stage assembly 120, and the positioning system 122. The control system 124 acquires measurement data, from the positioning system 122, that represent position and/or orientation and/or movement of the reticle 126 and/or wafer 128 with respect to the optical assembly 116 or another chosen reference. Based on these data, the control system 124 controls the assemblies 118, 120 to precisely position the reticle 126 and the wafer 128. The control system 124 can include one or more processors and electronic circuits, at least one of which may be specifically programmed to perform steps of data acquisition, data processing, and control of operation of the components of the apparatus 100.

Generally, the exposure apparatus 100 can be used as a scanning type photolithography system for optical transfer of a spatial pattern from the reticle 126 onto the wafer 128, with the reticle 226 and the wafer 228 moving synchronously. Alternatively, the exposure apparatus 120 can be used as a step-and-repeat type photolithography system that exposes the reticle 126 while the reticle 126 and the wafer 128 are stationary. The use of the exposure apparatus 100, however, is not limited to a photolithography system for semiconductor manufacturing and can include, as a non-limiting example, the use as an LCD photolithography system that projects a liquid crystal display device pattern onto a rectangular glass plate or a photolithography system for manufacturing of a thin film magnetic head.

In order to measure x-, y-, and/or z-coordinates or other positional parameters of a stage carrying an object (and, in a specific case, those of a wafer-stage) moving in the reference system of the exposure tool during its operation, a two-dimensional (2D) diffraction grating is typically employed in conjunction with such stage. This grating may be interchangeably referred to below as a wafer-stage grating. Each light beam that is nearly normally incident onto such grating forms, in diffraction at the grating, four primary first-order-diffraction beams: two diffracted beams representing respectively +/−1 orders of diffraction in the xz-plane and two diffracted beams representing respectively +/−1 orders of diffraction in the yz-plane. Light efficiency is rather critical during the measurement of the wafer-stage positioning, so ideally all four of these first-pass diffraction orders are used as part of the measurement (as opposed to creating multiple first pass beams, one for each measurement). The basic principle of such measurement requires the measurement light beam to pass off/be diffracted by the wafer-stage grating twice (while being retroreflected towards the grating in between the two occurrences of the diffraction) so that any change of tip or tilt of the grating does not result in or cause a corresponding tip or tilt of the measurement beam of light. This is where the related art took advantage of the use of "corner cube reflectors" to effectuate such retroreflection. See, for example, FIG. 2A (corresponding to FIG. 2B from U.S. 2013/0128255), which shows the use of four individual constituent corner cube retroreflectors and four shear-correction prisms required to effectuate four measurements, in the xz- and yz-planes, based on a single input beam of light. (For description of all optical elements and the overall system of FIG. 2A, the reader is referred to the description of FIG. 2B of U.S. 2013/0128255). Notably, all these optical elements have to be tediously aligned relative to one another to provide for accurate and reliable measurement(s). Similarly, the use of a monolithic optical such as an optical cuboid with corners configured to perform as cataphotes for light internally incident onto such corners has been utilized by, for example, U.S. Pat. No. 9,201,313 (two embodiments of such monolithic optical component utilized in encoder heads of U.S. Pat. No. 9,201,313 are shown in FIGS. 2B, 2C, with element 105 designating the wafer-stage diffraction grating).

Figure 3A:
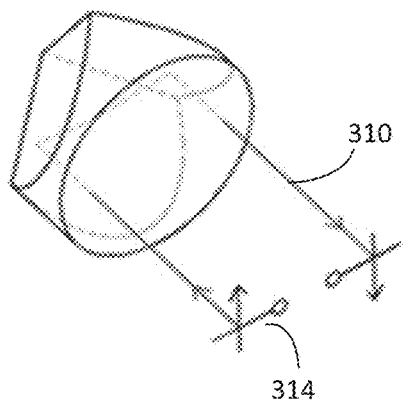
FIGS. 3A, 3B provide schematic examples of typical stand-alone, individual corner-cube retroreflecting structures.
Figure 3B:
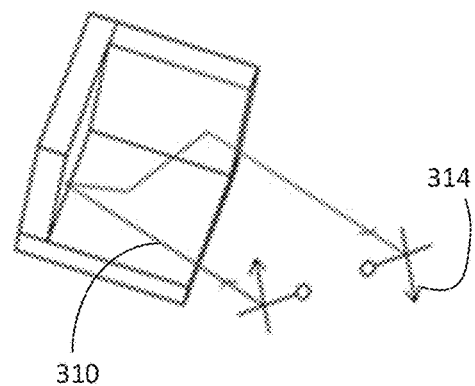

For the purposes of this disclosure, and as understood in the art, an individual corner retro-reflector (or an individual corner-cube prism, or an individual cataphote) is conventionally defined as a stand-alone optical component configured to return a beam incident thereon directly in a retroreflected fashion, towards the point of origin of such beam (with possible lateral displacement of the beam), regardless of the beam's angle of entry into the corner-cube retroreflector. Diagrams of a typical individual cataphotes is provided in FIGS. 3A, 3B, where arrows 310 indicate either input or output beams of light and schematics 314 illustrate the preservations or change of parity and orientation of an image formed in light reflected by the corner cube with respect to those of an object. In reference to FIGS. 2B, 2C it is appreciated that the internal corners of the components of FIGS. 2B, 2C operate on internally-propagating light beams in the same exact fashion.

General Considerations:

Encoder heads of the related art, configured for measuring the position of a target component (disposed, for example, on a wafer stage) or the position of the wafer-stage itself with sub-nm accuracy, are typically structurally complex and require the use of many optical components and/or tight operational tolerances and difficult alignment of such components. Optical engineers find themselves in a tight spot in attempt to satisfy several operational requirements that are targeted for an encoder head to work properly, while continuing the quest for reducing the complexity and cost of the encoder heads. These target perational requirements may include:

1. Two passes, of the measurement beam of light, off or by the measurement diffraction grating (wafer-stage grating) with a return reflection of light occurring in between these two passes, in order to remove tip/tilt errors from the measurement beam;
2. Utilizing the measurement beam with the largest diameter possible (for a given encoder head package size) to average the results of the measurement over as many grating grooves/rulers/line as possible; and, last but not least, 3. Achieving high light efficiency (as a 2D diffraction grating is at best about 20% efficient on each of the 2 passes of the measurement beam of light by the grating).

A person of skill in the art is also often concerned with some optional requirements, the satisfaction of which is sometimes desirable. These may include:
1. Reducing the size of the resulting encoder head package to the smallest possible;
2. Reducing the number of utilized optical components;
3. Increasing the relative ease of alignment by utilizing double pass elements, etc.
4. Utilization of all 4 diffraction orders from the $1^{st}$ pass beam (to increase light efficiency), and
5. Ensuring the operational ease of fiber-centered input/output of light into the encoder head unit (if such input-output is, indeed, employed).

The appreciation of the fact that additional, reference light beams are also necessarily present/formed in the encoder head system begs additional questions: Is it required for such reference beams of light to be also incident on/interact with the diffraction grating, thereby removing z—(that is, axial) sensitivity of the measurement? Can the reference beams of light be generated with high efficiency while requiring minimal space in the package of the overall encoder head? The realization of an unsolved need to prevent parallel stray light beams from being introduced into a measurement system and causing non-linear errors in the measurement adds another level of deliberation of an operably-successful design of an encoder head.

All these are the considerations and motivations behind the design of the embodiments discussed below.

Operational problems and limitations, caused by the use of multiple individual optical corner-cube retroreflectors in an encoder head of a lithographic exposure tool to form four diffracted measurement beams (required for the determination of change of spatial orientation of a target component with respect to the encoder head) are addressed by utilizing for the same purpose a single, substantially geometrically-perfect block of isotropic optical material in combination with optically-isotropic wedged elements disposed, in operation, between the block and the target component.

One resolved problem is the need to utilize multiple spatially-distinct optical corner cube retroreflectors, each of which is produced at a high cost. Such need is now substituted with a use of an optical system that includes a single optically-isotropic optical block to which a number of weakly-wedged isotropic optical plates are either pre-attached or simply juxtaposed.

Another resolved problem is the operational cost and time associated with necessary mutual alignment of multiple beam-folding and beam-steering prisms, and multiple optical corner cube retroreflectors (with respect to both the input light beam, produced by a light source used with the encoder head, and diffracted beams, formed from such input light beam by a wafer-stage diffraction grating of the exposure system). Such mutual alignment may be now replaced with a simple alignment, with respect to only the input light beam, of the optical system that includes a single optically-isotropic optical block in combination with a number of weakly-wedged isotropic optical plates.

Yet another addressed problem is the limitation conventionally imposed by the structure of encoder head that contains multiple corner cube retroreflectors (cataphotes) on the size of the input beam of light. Embodiments of the current invention may allow for increase of the cross-section of the input beam, which, in operation, translates into substantial reduction of measurement errors previously caused by imperfections of the wafer-stage diffraction grating employed in the measurement.

Furthermore, the proposed design may ensure that an axis along which a measurement beam of light is returned by the measurement arm of the encoder head towards the optical detection unit angularly deviates from the axis along which the measurement beam of light enters the measurement arm of the encoder head (the input beam) or, stated differently, that at least the measurement arm of the encoder head, as a whole, does not perform the act of retroreflection of light, to help prevent parallel stray beams from being introduced into the light-measurement system from unwanted reflections that make multiple passes through at least part of the encoder head and still emerge parallel to the measurement beam(s).

In certain embodiments the encoder head assembly, configured according to the idea(s) of the invention, may enable such operational and/or structural features as: (i) improved sensitivity to the wafer-stage displacement in reference to the encoder head; (ii) improved light efficiency; (iii) inhibition of a cyclic non-linear error (CNLE), or stray light rejection; (iv) minimal non-common beam path; (v) minimal number of stand-alone output optical fibers; (vi) reduced in size and complexity optical assembly of the encoder head for a given diameter of the measurement beam.

The practical implementation of the idea discussed in this application (which is based on the realization that configuring the encoder head around the use of a single, solid, optically-isotropic cuboid made of an optically-transparent material and complemented with weak optically-isotropic wedges) is both structurally and operationally distinct from an encoder head utilizing a multiplicity of distinct prismatic retro-reflecting elements (such as that shown in FIG. 2A), an encoder head structured around a monolithic optical component the internal corners of which are retro-reflectors (such as that of FIGS. 2B, 2C), and an encoder head utilizing the frustrated optical block (as discussed, for example, in 62/320,985).

Unless specified otherwise, the terms "single element", "single optical element", "sole element" and similar terms are defined to refer to an optical body that is monolithic—that is, consisting of one piece (initially solid or unbroken, as opposed to one integrated or constructed from several pieces each of which has, on its own, identifiable geometrical boundaries) of the same, single optical material—and that is characterized by spatially uniform, isotropic optical and mechanical properties. Accordingly, an optical element formed as a result of combining (whether integrally or otherwise) several individual optical elements into one integral whole is not considered to be a single and/or sole optical element as defined herein.

In particular, the implementations of the idea discussed in this application solve problems of (i) structural complexity of a conventional encoder head for use in an exposure tool and (ii) burdensome alignment of the multitude of optical prisms in the process of forming such encoder head by substituting the multiplicity of corner-cubes with a single, substantially geometrically-perfect cuboid of glass that, in operation with the diffraction grating of the wafer-stage, simultaneously forms four interferometric signals for measuring x-, y, and z-positions of a wafer-stage grating relative to the encoder head. Unless specified otherwise, the term "cuboid" is used to define a parallelepiped of which all faces are rectangular. The term "substantially geometrically perfect", when used in reference to a shape of a particular optical body, denotes a minimized deviation from the otherwise-determined or known shape of such body as accepted in results of fabrication of such body employed as known in the art. One example would be an optical cube with a corner as a result of internal reflection at which the beam of light is retro-reflected, or returned along the same axis it had when impinging on the corner, with a possible angular deviation not exceeding, for example, 3 arcseconds. In a related embodiment, the identified angular deviations do not exceed 5 arcseconds; in yet another embodiment—an arcsecond.

Non-Limiting Examples of Implementation

Figure 4:
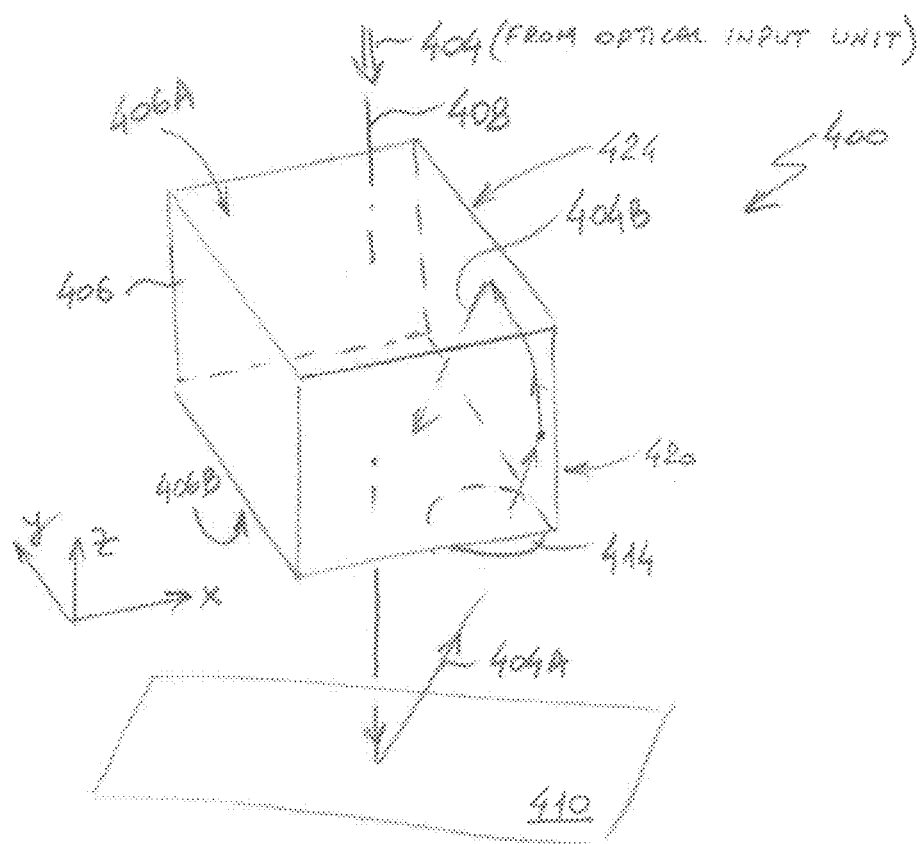
FIG. 4 is a schematic illustration of an embodiment.

FIG. 4 provides a schematic illustration for an embodiment 400, showing a portion of the measurement arm of the optical system of the invention, to which an input measurement beam 404 is delivered (frequently—from a beam-splitting optical component such as a polarization beam splitter or PBS, not shown) along the axis 408. The linearly polarized input measurement beam 404 is typically normally incident in the −z direction onto an optically-isotropic single, sole block 406 of optically-transparent material and then transmitted through the block 406 towards an optical surface 410. Generally, the optically-isotropic block 406 had an input facet 406A through which the incident beam 404 penetrates through the block 406, an output facet 406B (that is opposite to the input facet 406A and through which the beam 404 exits the block 406 towards the surface 410), and multiple side facets or surfaces connecting the input and output facets 406A, 406B. (In the specific example of FIG. 4—which example is used for various illustrations and explanations further on—the block 406 is configured as a substantially geometrically-perfect cuboid made of, for example, fused silica. In a related embodiment, the block 406 can be configured as a hexagonal prism.)

The optical surface 410 is configured to return at least a portion 404A of the beam 404 in the direction of an optically-isotropic wedge element 414. The wedge element 414 is disposed underneath the output facet 406B of the block 406 and aside from the axis 408, that is, such as to not intersect the axis 408. In one specific embodiment, the axis 408 is an axis of symmetry of the input facet 406A; in a related embodiment, the axis 408 is an axis of symmetry of the block 406. When the optical system with the measurement arm 400 is used as part of an encoder head for measurement of position and/or orientation of a target optical piece (such as a substrate, for example) disposed in a lithographic exposure tool, the optical surface 410 may be represented by a diffraction grating carried by the stage (not shown) to which the target optical piece is affixed in the exposure tool.

As discussed below, the beam 404A is further transmitted through the wedge 414 and through the block 406 while being retroreflected internally (see 404B) in the block 406 by a combination of two side facets and the input facet 406A of the block 406. It is appreciated that edges formed at intersections of two side facets of the block 406 (such as the edge 420, for example) may be configured to not contain a bevel, while edges formed at intersections of the input facet 406A with any of the side facets (such as the edge 424) may contain a bevel. Generally, an embodiment does not require that all edges of the block 406 contain bevels (and, as a person of skill will appreciate, the presence of bevels on all edges of the block makes the process of fabrication of an optical component easier and is, therefore, desired and preferred in practice). While not indicated in FIG. 4 for the simplicity of illustration, upon exiting the block 406 light from the portion 404A, 404B of the measurement beam is further redirected by the surface 410 through the block 406 such as to egress the block 406 through the input facet 406A substantially along the z-axis but yet in a direction that angularly deviates from the axis 408.

Accordingly, one implementation of a discussed idea provides an optical system configured to reflect an input beam of light to form a reflected beam of light. Such optical system includes a combination of (i) an optically-isotropic block that has rectangular facets including an input facet, an output facet opposite to the input facet, and multiple side facets connecting the input and output facets, and (ii) an optically-isotropic optical wedge element disposed along the output facet such as to not intersect an axis of symmetry of said input facet. The optical system additionally includes an optical surface separated from the block by the wedge element and configured to redirect a portion of the input beam that has entered the block through the input facet and that traversed both the block and the optical wedge element, towards the combination. The input facet of the block forms a right dihedral angle with each of the side facets, while each of the side facets of the block forms a right dihedral angle with each of neighboring side facets.

Figure 5B:
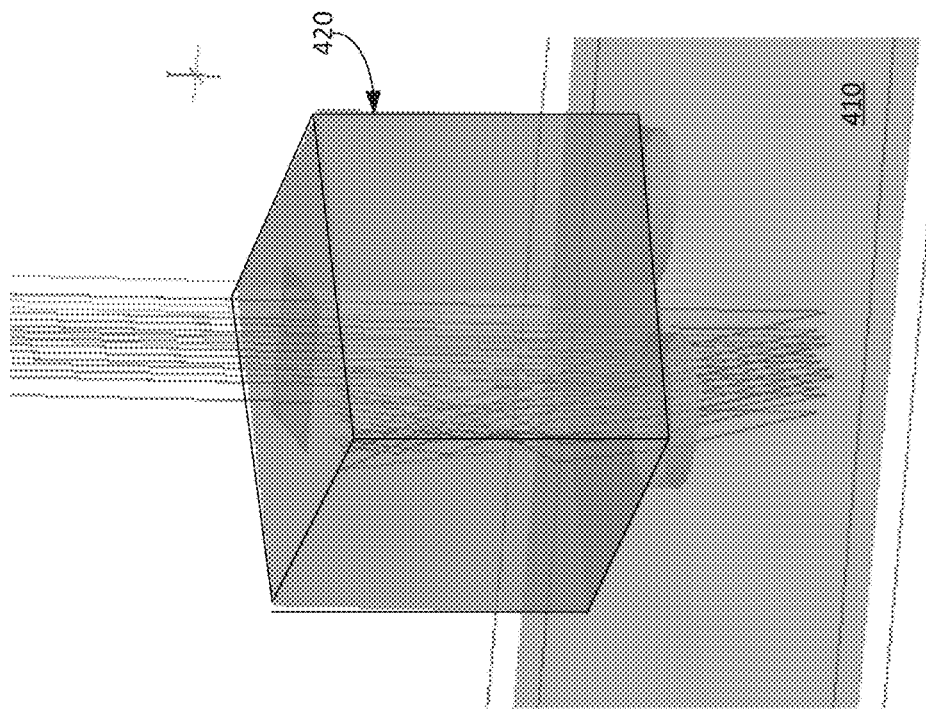
FIGS. 5A, 5B illustrate propagation, through an embodiment, of an input measurement beam and a measurement sub-beam formed as diffraction order at a wafer-stage diffraction grating.
Figure 5A:
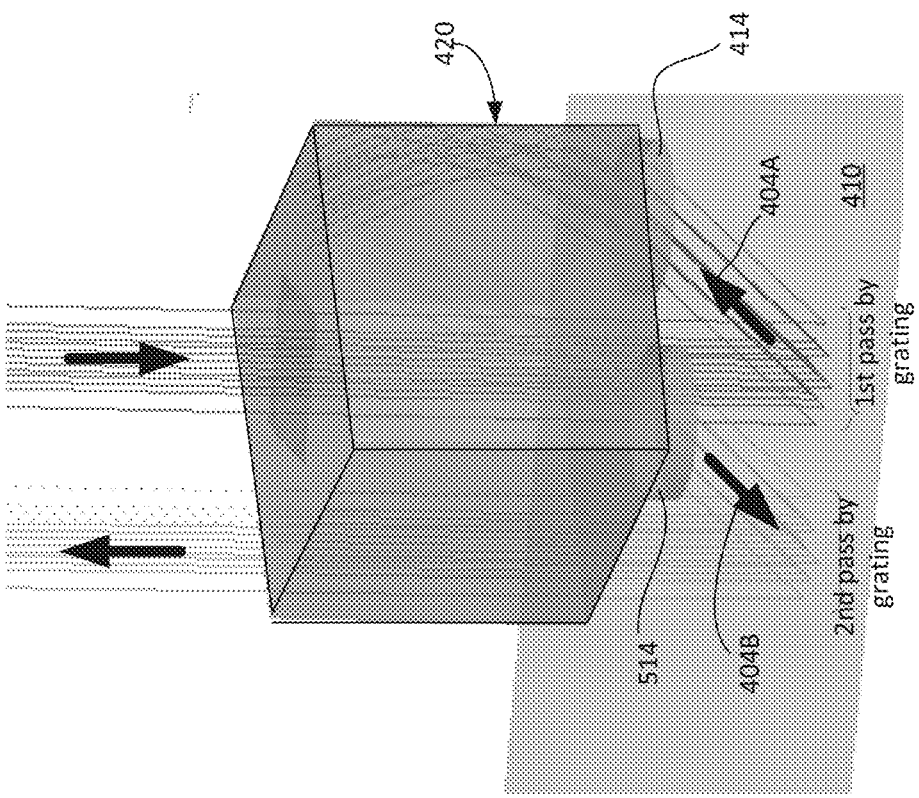

As shown in additional detail in FIGS. 5A, 5B where the element 410 is configured as a diffraction grating (for example, a 2D diffraction grating which, in operation of the lithography exposure tool, may be associated with the wafer stage, not shown), each of the top corners of the block 406 (the corners corresponding to the input surface 406A) are 90 degrees. FIGS. 5A, 5B schematically illustrate the propagation of the +1 diffraction order beams (FIG. 5A—in the case of diffraction in the xz-plane; FIG. 5B—in the case of diffraction in the yz-plane) formed from the measurement beam 404 at the grating 410. In order to prevent CNLE (cyclic non-linear error), a small, thin glass wedge(s) 414, 514 are positioned under the output facet 406B such as to not intersect the axis 408 along which the input beam 404 enters and exits the block 406.

In one implementation, the wedges 414, 514 may be adhered (using adhesive or fluid-assisted optical contacting, for example) to the bottom of the block 406 and positioned such that it changes the angle of the beam 404A (representing a +$1^{st}$ order of diffraction of the measurement beam 404 in the xz-plane) as it travels up towards the glass block 406 after the first pass by the grating 410. After being retroreflected internally within the block 406, the now-referred-to-as 404B beam exits the block 406 through the central portion of the output facet 406B, not covered by any of the wedges of the system 500. Effectively, the combination of the wedge 414 with the substantially geometrically perfect cuboid 406 makes the beam 404B return towards the grating 410 not along the path of retroreflection of the beam 40A, but along a path that is inclined with respect to the path of the beam 404A by an angle dependent on the angle of the wedge 414. Stated differently, the combination of the wedge 414 and the block 406 amounts to a frustrated retroreflector. In a specific embodiment, in addition to the described combination, the bottom surface of the block 406—its output facet—may be tilted to form an angle of about 0.5 degrees with respect to the input facet to prevent the 0th order diffracted beam formed at the grating 410 at the $1^{st}$ pass from contributing to the CNLE). FIG. 5B illustrates the propagation of the measurement sub-beam formed as a +$1^{st}$ order of diffraction in the yz-plane through the combination of the block 406 and the wedge 514. In one implementation, the wedges 414, 514 are spatially 'clocked' or oriented such that thinner ends of each of the wedges 414, 514 are turned away from the axis 408.

Figure 6:
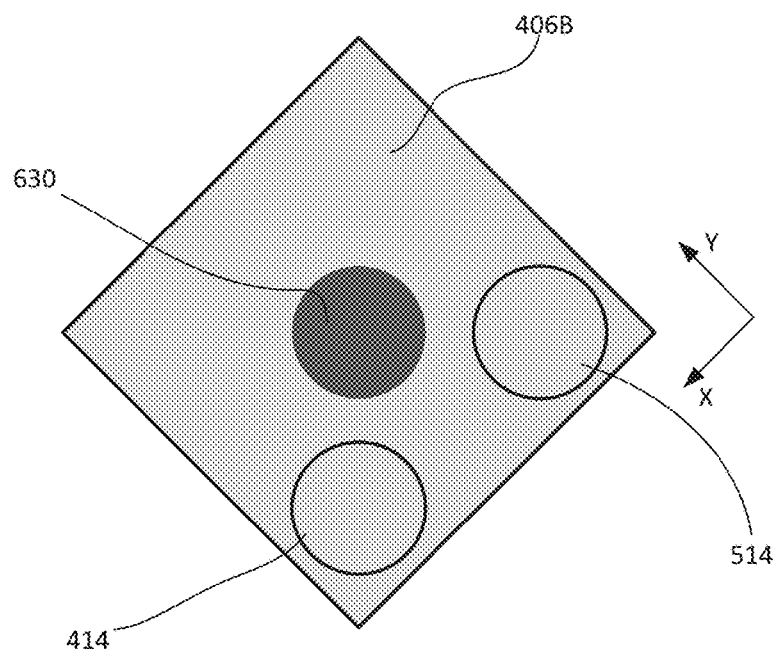
FIG. 6 is a schematic bottom view of embodiments of FIGS. 5A, 5B.

FIG. 6 provides a schematic bottom view of the system 500, with an indication of the central area 630 of the output facet 406B as the area through which measurement sub-beams formed as a result of the first occurrence of diffraction of the measurement beam 404 at the grating 410 (that is, the beams representing first-order diffraction of the beam 404 in either xz- or yz-planes) are returned to the grating 410 for the second pass or interaction with the grating after being retro-reflected internally within the block 406. The angle of the wedge(s) 414, 514 needs to be large enough to prevent CNLE, but yet small enough to permit the embodiment to compensate for the tip/tilt of the stage carrying the grating 410 to better than about 3 arcseconds. In one implementation, the wedge angle is between 0.5 and 4 degrees.

Figure 7:
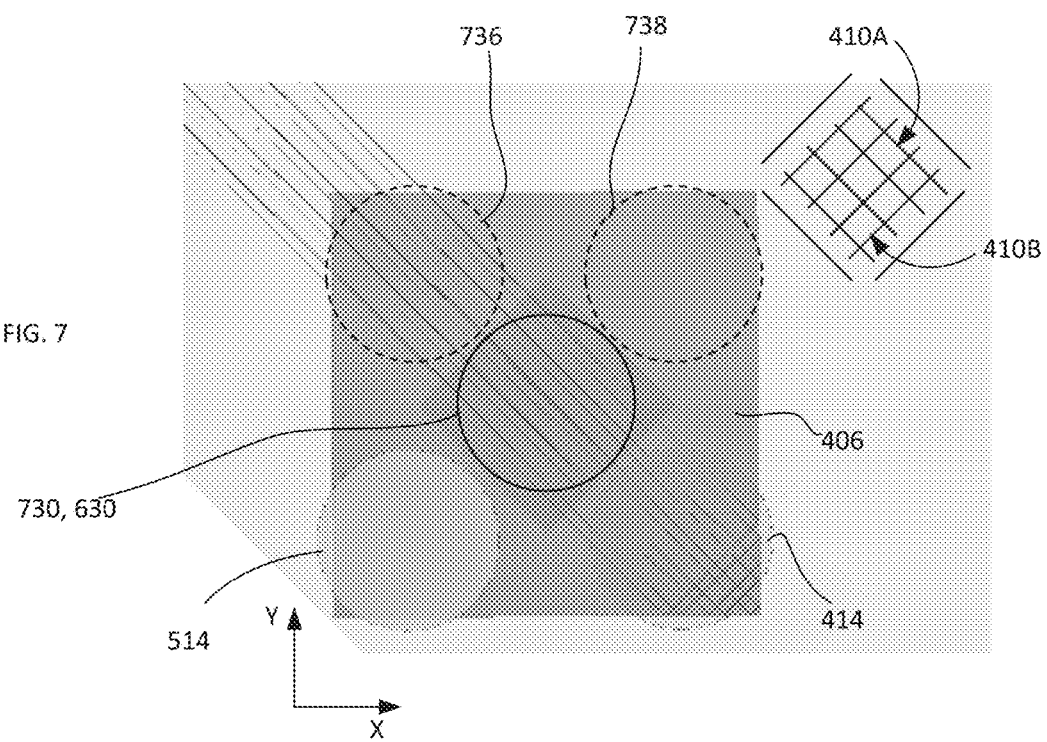
FIG. 7 is a schematic top view of the embodiment of FIGS. 5A, 5B in spatial relation to a 2D diffraction grating.

When the optical system of FIGS. 4, 5A, 5B is configured as part of the measurement arm of an encoder head (for use with in the lithographic exposure tool, for example), the optical surface 410 is preferably configured as a diffraction grating carried by the wafer-stage of the exposure tool. The grating rulings or grooves of such grating, nominally disposed in a plane parallel to the xy-plane of the shown system of coordinates, are preferably inclined with respect to at least one of the x- and y-axes. When the wafer stage grating 410 is a 2D grating, and when its ruling are oriented at 45 degrees relative to the x- and y-axes, the orientation and positioning of the proposed embodiment of the encoder head with respect to the grating at which the proper operation of the head is enabled is readily identified, since the corners of the block 406 need to be aligned with the diffracted beams in order for the embodiment to work properly. This orientation of the grating rulings 410A, 410B is illustrated in FIG. 7, which provides a schematic top view of the embodiment, looking down at the encoder head block with the grating 410 below. The solid black circle 630 indicates the central portion of the input facet 406A (and a central portion of the output facet 406B, at which the input beam 404 passes through the block 406) while the two dashed circles 736, 738 indicate the areas of the input facet 406A through which the twice-diffracted measurement sub-beams exit the embodiment on their way from the measurement arm towards the optical detection unit.

Figure 8:
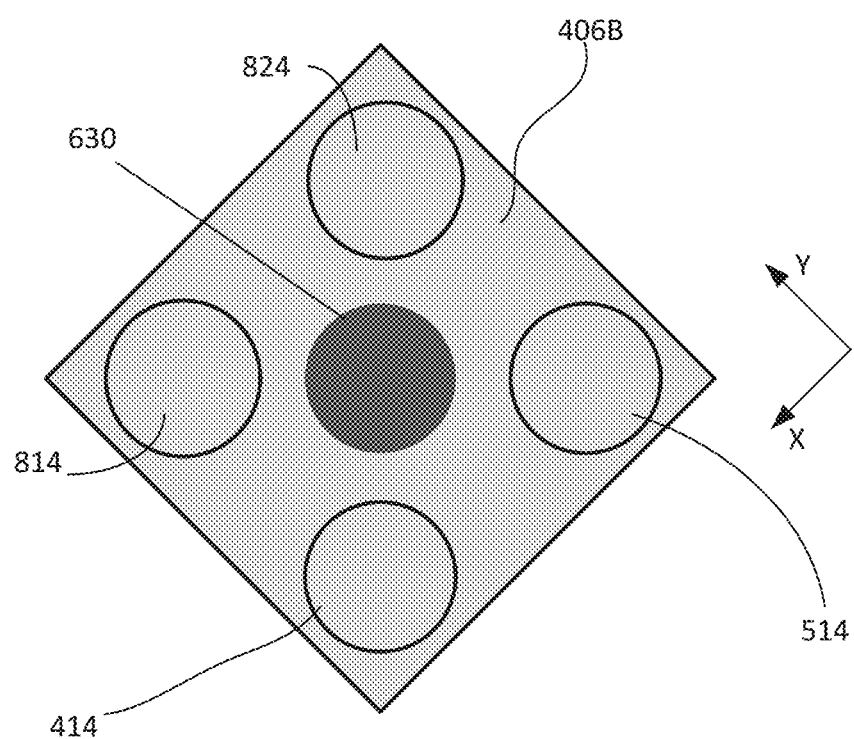
FIG. 8 is a bottom view of an embodiment configured for formation of four measurement (sub-)beams from the input measurement beam: 2 (sub-) beams formed as diffraction orders in xz-plane and 2 (sub-)beams formed as diffraction orders in yz-plane. The embodiment contains four optically-isotropic wedges disposed symmetrically with respect to axis of symmetry while leaving the central, axial portion of the optical block of the embodiment unobstructed for unhindered propagation of measurement beams through input and output facets of the optical block.

It is appreciated that in a related embodiment, to complement the measurement methodology described above with the measurement utilizing $-1^{st}$ order diffracted beams (in either xz- or yz-planes), each of the optically-isotropic wedges 414, 514 could be complemented with respectively-corresponding wedges 814, 824 as shown in bottom view of the embodiment 800 in FIG. 8. These complementary wedge elements are positioned symmetrically (about the axis 408, along which the measurement beam is delivered to the optical block 406) with respect to the wedges 414, 514, respectively. In one implementation, the thinner ends of wedges 414, 514, 814, 824 are turned away from the axis 408 such that the corresponding thicker ends are disposed closer to the axis 408 than the thinner ends. In a related embodiment, the wedges are clocked the other way: their thinner ends are turned towards the axis 408 such that the corresponding thicker ends are disposed farther away from the axis 408 than the thinner ends. Accordingly, the portion of the measurement arm of the embodiment as shown includes first and second optically-isotropic wedge elements which are disposed (between the optically-isotropic block and the optical surface configured to return at least one portion of the input measurement beam towards the block) symmetrically with respect to said axis of symmetry. The axis of symmetry can be defined to be perpendicular to the input facet.

The practically-beneficial nature of the implementation(s) of the idea of the invention also manifests in that the practical motion of the stage on which the target piece being measure and/or optical surface 410 are located (such as a wafer and a wafer-stage grating)—something on the order of +/−0.2 mm—is taken advantage of Embodiments of encoder heads of related art, configured to operate on the "topside" and/or "backside" with respect to the wafer-stage use one of corrective methods to prevent light beam shear as the wafer stage moves up and down, as this necessarily reduces contrast of the interferometric fringes detected with the optical detection unit and, therefore, reduces the measurement accuracy achievable in practice. Implementation of such corrective methods, at the same time, requires the use of additional prismatic optical elements, thereby increasing the complexity and cost of the embodiments of the related art. Since the application of the present embodiments utilizes a limited z-motion range, there is no need to compensate the shear of the light beam in any of the embodiments of the invention. Accordingly, in one implementation an embodiment of the encoder head of the invention is devoid of optical elements configured to compensate, in operation of the embodiment, for shear of a light beam delivered from the optical input unit to the measurement arm of the encoder head (shear caused by changes in the working distance between the encoder head and the measurement surface).

It will be readily appreciated by a person of skill in the art that another reason that current implementations make the compensation of the light-beam shear unnecessary stems from the fact that embodiments of the invention are structured to accommodate input measurement beam 404 having larger diameter, in contradistinction with related art. The contrast loss due to the shear is expressed as a ratio of shear translation to beam diameter. The above-discussed examples of designs of optical systems (see FIGS. 5A, 5B, for example) are dimensioned to utilize a 4 mm diameter beam 404. (In one implementation, for example, the dimensions of the block 406 are 14×14×12.6 mm^3, length×width×height; while the wedges are 6 mm in diameter and approximately 1 mm thick.) As a person of skill will appreciate, the larger the measurement-beam diameter, the better compensated, by spatial averaging, are measurement errors caused by imperfections of the diffraction grating 410. The cuboid block 406 of FIGS. 5A, 5B has a 12.6 mm side (in z-direction) and 14×14 mm cross-section in the xy-plane, resulting in a quite small footprint along the direction of the measurement beam 404 yet accommodating 4-mm-diameter measurement beam(s) propagating through the embodiment. The working distance (distance between the bottom surface of the isotropic wedges and the surface 410) is about 7.0 mm. A beam larger than 4 mm could be used as well if the overall glass block size were to increase (the latter coming at the expense of reduced spatial density of encoder heads in an array of encoder heads that can be used simultaneously with a given lithographic exposure system.

Figure 9:
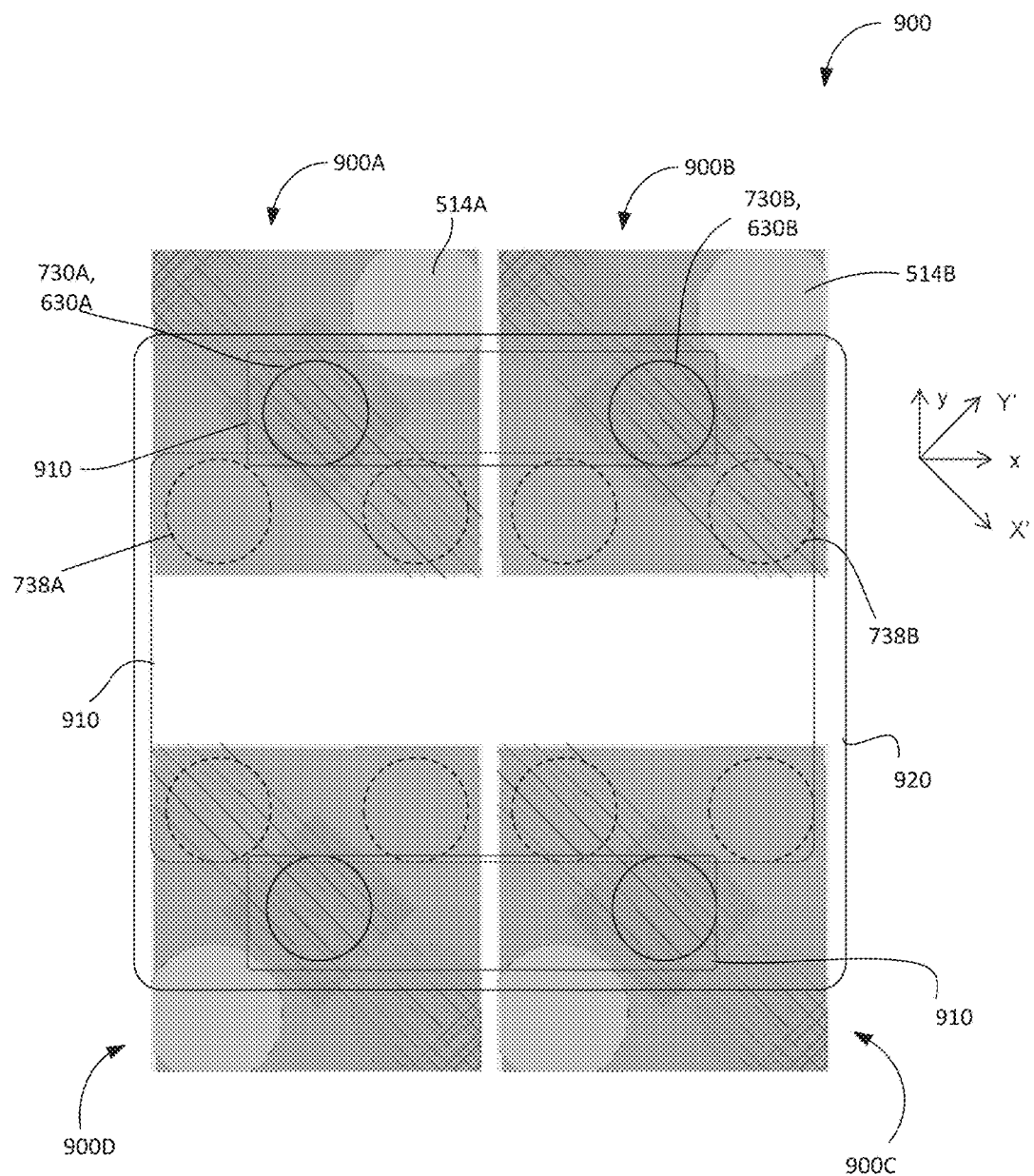
FIG. 9 illustrates a portion of the measurement arm of the system including an array of encoder heads collecting four measurement sets of data which can be used by a data-processing unit of the system to extract information about linear and angular spatial coordinates of the target piece under measurement.

FIG. 9 illustrates an example of the system of the invention that includes an array of four encoder heads (shown are only portions 900A, 900B, 900C and 900D of the corresponding measurement arms of the heads) of the type described in reference to FIGS. 5A, 5B, 7. This array provides 4 measurement sets of data which can be used by a data-processing unit to extract information about x, y, θx, θy spatial coordinates of the target piece located on the wafer-stage or the wafer-stage itself (the latter two being tip/tilt angles of the piece being measured in with respect to x- and y-axes). With the use of a reference interferometer (not shown), the signals provided by the embodiment of FIG. 9 can also be appropriately combined to give multiple measurements of the position of the measured piece along the z-axis thereby providing information about the (x, y, z, θx, θy, and θz) spatial coordinates of the target piece. The signal combinations required to get these values are understood by someone skilled in the art, and will not be described here in any further detail for that reason.

Figure 10:
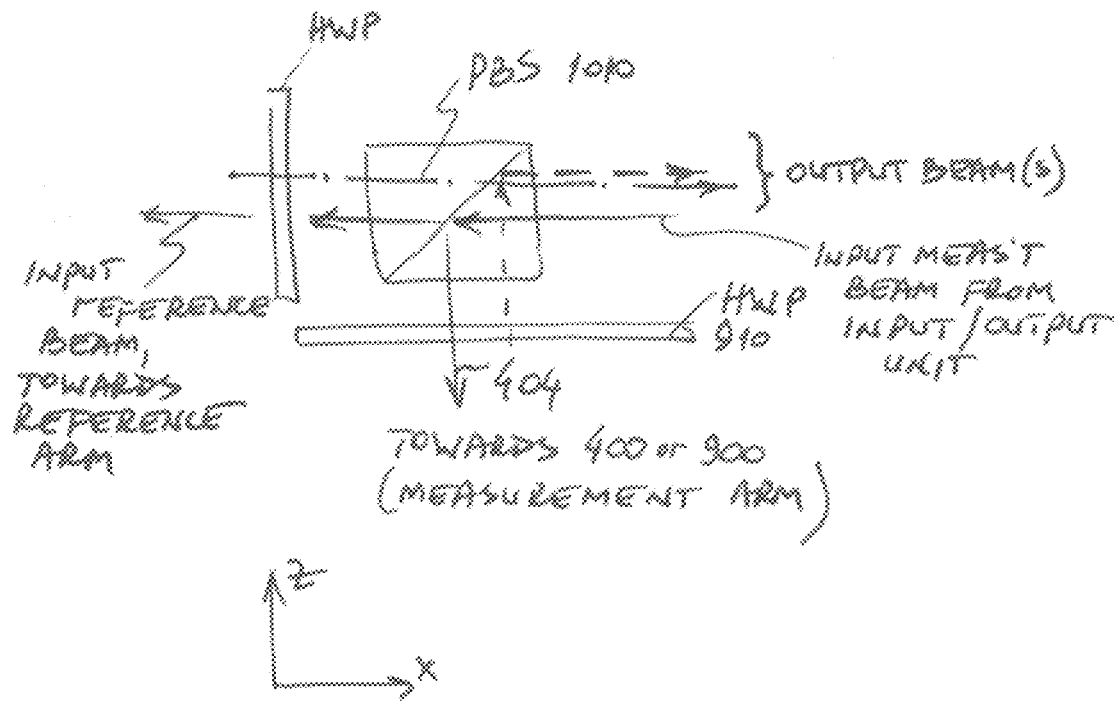
FIG. 10 is a schematic diagram of the embodiment employing a polarization element in each of the measurement and reference arms to appropriately align the vectors of polarization of the respectively incoming beams with respect to the planes in which the diffraction at the reference and wafer-stage gratings occurs in operation of the system.

Referring again to mutual orientation between the grating 410 and the block/wedges combinations of FIGS. 5A, 5B, 6, 7, and in further reference to FIGS. 9 and 10, it is also appreciated that in some embodiments it may be desired to align the measurement beam's linear polarization vector with a direction along which the wafer-stage-grating rulings are extended (that is, along the axes x' and/or y', at 45 degrees with respect to x- and/or y-axes). Accordingly, half waveplate (HWP) element(s) 910 oriented with their polarization axis/axes at 22.5 degrees may be used to rotate the polarization vector of the input measurement beam 404 prior to being incident on the grating by 45 degrees, to that is aligned to either X' or Y'. As shown, three HWPs 910 are employed; in a related embodiment, a single HWP can be disposed across the area outlined by the contour 920 to intersect all beams traversing the embodiments of the members 900A, 900B, 900C, 900D of the array 900. Each of the members 900A, 900B, 900C, and 900D of the array 900 is structured analogously to the embodiment 700 of FIG. 7 (which is indicated by corresponding labels assigned in FIG. 9 to only two members 900A, 900B, for simplicity of illustration): the solid black circles 630A, 630B indicate the central portion of the input facets of the corresponding optically-isotropic blocks of the members of the array, the two dashed circles 736A, 738B indicate the areas of the input facets through which the twice-diffracted measurement sub-beams exit the embodiment on their way from the measurement arm towards the optical detection unit, and so on.

When the measurement (sub-)beam(s) emerge from the optical blocks 406 of the members of the array 900 upon their return propagation after the second pass by (second occurrence of diffraction at) the grating, the polarization states of such beams are rotated back by 45 degrees so that the corresponding polarization vectors are properly aligned at the PBS 1010. The structure of the reference arm of the encoder head may be substantially similar to the structure of the measurement arm 400, 900 and may similarly require the use of the HWP. As schematically shown, the measurement and reference (sub-)beams are aligned (as facilitated by the embodiments of the invention—within about 3 arcseconds) at and transmitted through the PBS forming the output beam(s) to be returned towards the input/output optical unit (not shown).

The Light Input/Output Unit and General Structure of the Reference Arm.

The light Input/output unit (not shown) may include a dual-core polarization-maintaining (PM) input fiber component, where the fast axes of the two individual waveguiding channels are oriented 90 degrees relative to each other, to deliver the input light towards the PBS 1010 through the collimating lens element. At the PBS 1010, the input beam is split into the input measurement beam(s) propagated towards the measurement arm of the embodiment and the reference beam(s) propagated towards the reference arm of the embodiment. The measurement side/portion of the encoder head, as was discussed above, transforms the input beam 404 as a result of several occurrences of diffraction, propagation through the optically-isotropic wedge(s) and perfect retro-reflection inside of the optical block(s) 406, and rotation of the initial polarization state of the input beam 404 in the HWP 910 to form 2 (or 4, depending on whether a 1D grating or 2D wafer-stage diffraction grating is being used) measurement (sub-)beams that are returned from the measurement portion of the encoder head towards and again transmitted through the PBS upon return along the z-axis.

Since the determination of the change of at least one of the position and orientation of the wafer-stage, carrying the grating 410, is made based on the analysis of the interferometric signal derived from the output light by data-processing circuitry of overall exposure system (as would be readily recognized by a skilled artisan), the purpose of the reference portion (subsystem) of the encoder head, not shown, is to generate 2 (or 4, depending on the type of the diffraction grating 410 used) reference beams and return them towards the PBS 1010 in a fashion similar to that of the measurement portion 400, for example, for further spatial overlap with the measurement (sub-)beams. The group of the two (or four) reference (sub-)beams is characterized by the same output angles as those shown for the corresponding measurement (sub-)beams. Therefore, the axis along which a given reference (sub-)beam is returned to the PBS 1010 after having propagated through the reference arm and diffracted twice at the reference grating of the embodiment also differs from the axis along which the input reference beam initially entered the reference arm through the PBS 1010 (in the same fashion as the measurement sub-beams formed within the measurement arm of the encoder head are returned towards the PBS 1010 at angle(s) with respect to the axis along which the beam 404 initially entered the measurement arm). Each of the measurement (sub-)beams returned to the PBS 1010 has substantially the same power as a corresponding one from the group of the reference (sub-) beams. The polarization states of the reference (sub-)beams prior to impinging on the PBS 1010, however, are orthogonal to those of the measurement (sub-)beams. As a result, the PBS 1010 reflects the measurement (sub-)beams while transmitting the reference (sub-)beams, or vice versa. After the beams are recombined by the PBS, a polarizer (not shown) may be required to ensure that these measurement reference beams have the same state of linear polarization state, so that they can optically interfere and produce interference signal required to measure the phase difference between the beams.

The output portion of the input/output unit may, generally, be represented by separate individual multimode output fibers (two fibers in the embodiment utilizing a 1D diffraction gratings in the reference and measurement arms, and 4 fibers in the case utilizing a 2D diffraction gratings in the reference and measurement arms).

Each of the input and output channels of the reference arm may additionally contain a set of Risley prisms positioned (in reference to FIG. 10) to the right of the PBS 1010 and used to facilitate coupling of the combined measurement and reference (sub-)beams into output optical fibers of the input/output optical unit. In particular, the set of Risley prisms would be used to change the tilts of optical beams passing therethrough, if required. It is appreciated that, advantageously, no specific tight-tolerance alignment of the set of Risley prisms across the combination of measurement/reference beams returning, as output beams, towards the input/output unit is required because of the simplicity of the proposed encoder head design and loose tolerance requirements on the optics of the embodiment. In its simplest form, the reference optical (sub-)system of the encoder head can be structured in a fashion substantially identical to that of the measurement portion, except that the reference grating would be held in a fixed position relative to the reference cuboid. Alternatively, the reference optical portion of the encoder head can be configured in a more conventional fashion, with the use of individual corner-cube retroreflectors (which, understandably, will unnecessarily partially complicate the goal of simplifying the design already reached in the proposed embodiment).

Figure 11:
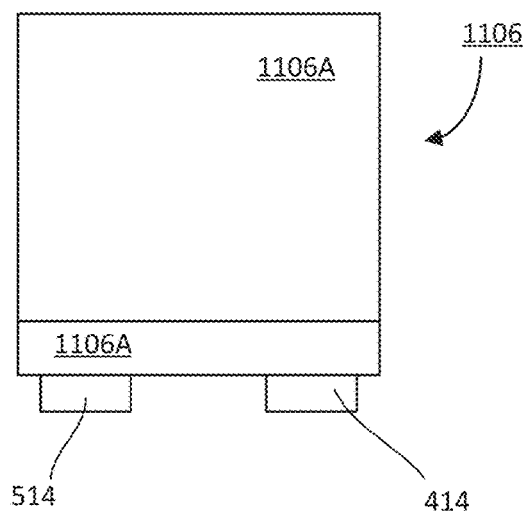
FIG. 11 is a schematic diagram of a modified embodiment of the optical block.

In one specific implementation, and without the loss of generality, the block 406 may be substituted with a plurality of sub-blocks (by analogy with the arrangement 1106 of sub-blocks 1106A, 1106B, optically adhered to one another, as shown in FIG. 11).

It is appreciated, therefore, that the idea of the invention stems from the realization that judiciously chosen optically-isotropic elements (including spatially-wedged isotropic elements), used in conjunction with a substantially geometrically-perfect single optically-isotropic cuboid, achieve (as a combination) the effect of imperfect retro-reflection of a light beam arriving from the input/output unit back to the input/output unit thereby allowing for a compact, nearly CNLE-free encoder head that accommodates large-diameter beams of light (4 mm diameter beams in the considered example).

Disclosed aspects, or portions of these aspects, of the invention may be combined in ways not listed above. Accordingly, the invention should not be viewed as being limited to the disclosed embodiment(s).

The invention claimed is:

1. An optical system configured to reflect an input beam of light to form a reflected beam of light, the optical system comprising:
   a combination of
      an optically-isotropic block having rectangular facets including an input facet, an output facet opposite to the input facet, and multiple side facets connecting the input and output facets, and
      an optically-isotropic optical wedge element disposed along the output facet such as to not intersect an axis of symmetry of said input facet,
   and
      an optical surface disposed to redirect a portion of said input beam, that has entered said block through the input facet and traversed said block, towards said optical wedge to traverse first the optical wedge element and then the output facet,
   wherein the input facet forms a right dihedral angle with each of the side facets and each of the side facets forms a right dihedral angle with each of neighboring side facets.

2. The optical system according to claim 1, wherein said combination includes first and second optically-isotropic optical wedge elements disposed between said block and said optical surface symmetrically with respect to said axis of symmetry, wherein said axis of symmetry is perpendicular to the input facet.

3. The optical system according to claim 2, wherein the combination and the optical surface are mutually oriented such that an optical beam, formed by said portion of the input beam that has been redirected by the optical surface,
   is transmitted through the first optical wedge element and through the output surface,
   is retroreflected internally in said optically-isotropic block, and
   is further redirected by said optical surface through the second optical wedge element, through the output surface, and through the input surface to form said reflected beam,
   wherein the reflected beam is inclined at a non-zero angle with respect to the input beam.

4. The optical system according to claim 1, wherein said optically-isotropic wedge element is oriented to have its thick end closer to the axis of symmetry than its thin end.

5. The optical system according to claim 1, wherein said optical surface includes a surface of a diffraction grating having grating rulings oriented at a non-zero angle with respect to each of sides of the input facet.

6. The optical system according to claim 5, wherein said diffraction grating is a two-dimensional (2D) diffraction grating, and wherein the optical system includes four optically-isotropic wedges disposed along the output facet such that a thick end of each of said four optically-isotropic wedges is closer to a center of the output facet that a thin end of each of said four wedges.

7. The optical system according to claim 6, wherein none of the four optically-isotropic wedges intersects the axis of symmetry.

8. The optical system according to claim 1, wherein the output facet is parallel to the input facet.

9. The optical system according to claim 1, wherein the output facet is inclined at a non-zero angle with respect to the input facet.

10. The optical system according to claim 1, wherein the combination is configured as a part of an encoder head of a lithographic exposure tool, said encoder head further comprising
    an optical input unit including an input optical fiber configured to deliver said input beam, and
    an optical output unit including an output optical fiber configured to received and collect said reflected beam, wherein the reflected beam is inclined at a non-zero angle with respect to the input beam.

11. An encoder head configured for use in a lithographic exposure tool that includes a wafer-stage carrying a diffraction grating, the encoder head comprising a measurement arm including an optically-isotropic cuboid and at least one optically-isotropic wedge element that is disposed between the cuboid and the diffraction grating and without intersecting an axis of symmetry of said cuboid,
    wherein the measurement arm is configured to return an input beam, delivered to the measurement arm along a first axis, along a second axis that is inclined at a non-zero angle with respect to the first axis.

12. The encoder head according to claim 11, wherein said at least one optically-isotropic wedge element includes first and second optically-isotropic wedge elements, and wherein the encoder head is configured
    to receive at least two measurement sub-beams formed as a result of diffraction of said input beam at the diffraction grating,
    to transmit each of said at least two measurement sub-beams through said first wedge element and through said second wedge element, and
    to transmit each of said at least two measurement sub-beams through said cuboid while retroreflecting each of said two measurement sub-beams inside the cuboid.

13. The encoder head according to claim 12, wherein each of said first and second optically-isotropic wedge elements is configured to change a direction of incidence of a corresponding one from the at least two measurement sub-beams onto the cuboid.

14. The encoder head according to claim 11, wherein said encoder head does not contain a stand-alone optical component configured as an optical retro-reflector.

15. The encoder head according to claim 11, further comprising
an optical input unit including an input optical fiber configured to deliver said input beam, and
an optical output unit including at least one output optical fiber configured to receive and collect a reflected beam.

16. The encoder head according to claim 11, wherein said at least one wedge element includes first and second wedge elements disposed symmetrically with respect to an axis of symmetry of said cuboid.

17. An encoder system comprising:
a diffraction grating; and
an encoder head that
(i) includes
a single cuboid of optically-isotropic material disposed to transmit an input beam of light, delivered along a first axis, towards the diffraction grating; and
a plurality of optically-isotropic wedges between said cuboid and said diffraction grating;
(ii) is configured to form, from said input beam, a plurality of measurement beams each of which diffracts at said grating twice and is transmitted through first and second wedges of said plurality of optically-isotropic wedges; and
(iii) is configured to form, from said input beam, reference beams and combine each of said reference beams with a corresponding measurement beam from the plurality of measurement beams to form a plurality of output beams each of which is directed along a second axis, wherein the second axis is not parallel to the first axis.

18. The encoder system according to claim 17, further comprising
a plurality of optical detectors, each configured to acquire light from a corresponding output beam from the plurality of output beams; and
electronic circuitry configured to receive interference signals from the plurality of optical detectors and to extract data representing at least one of position and orientation of the diffraction grating based on phases of such interference signals.

19. The encoder system according to claim 18, wherein said phases represent differences of optical paths between respectively-corresponding measurement and reference beams in each of the output beams.

20. The encoder system according to claim 18, further comprising an optical unit configured to deliver the input beam of light to said cuboid and to collect output beams from the plurality of output beams.

21. The encoder system according to claim 20, wherein said optical unit includes a plurality of optical fibers each disposed to collect light from a corresponding one from said plurality of output beams.

22. A method for determining a position of a target placed in a lithographic exposure tool, the method comprising:
transmitting a first portion of light, delivered to an encoder head of said exposure tool, along a first axis through top and bottom surfaces of an optically-isotropic cuboid of said encoder head towards a diffraction grating to form an input measurement beam of light; and
diffracting light from said input measurement beam of light twice at said diffraction grating to form a first output measurement beam of light transmitted, through said bottom and top surfaces, along a first output axis that is inclined with respect to the first axis at a non-zero angle.

23. A method according to claim 22, wherein said transmitting a first portion of light along a first axis through top and bottom surfaces of an optically-isotropic cuboid includes transmitting said first portion through said top and bottom surfaces that are parallel to one another.

24. A method according to claim 22, further comprising
traversing light from the input measurement beam, which has diffracted once at said diffraction grating, through the bottom surface of the optically-isotropic cuboid to form a first internal beam propagating through the cuboid internally along a first internal axis; and
reflecting said first internal beam internally within the optically-isotropic cuboid to form a second internal beam propagating along the first internal axis towards the bottom surface.

25. A method according to claim 24, further comprising changing a direction of propagation, of said light from the input measurement beam, after said diffracting and before said traversing.

26. A method according to claim 25, further comprising
transmitting light from the second internal beam through the bottom surface, and
impinging said light from said second internal beam onto the diffraction grating with no optical element intervening in an optical path of said light between the bottom surface and the diffraction grating.

27. A method according to claim 26, further comprising changing a direction of propagation, of said light from the second internal beam, after said transmitting and before said impinging.

28. A method according to claim 22, further comprising, between first and second occurrences of diffraction of the light from said input measurement beam,
transmitting said light only once through an optical wedge, and
retroreflecting said light internally within said optical cuboid.

29. A method according to claim 22, further comprising propagating light from said input measurement beam, which has diffracted once at said diffraction grating, through an optically-isotropic wedge element disposed between the diffraction grating and said optical cuboid.

30. A method according to claim 22, further comprising diffracting the light from said input measurement beam of light twice at said diffraction grating to form a second output measurement beam of light transmitted, through said bottom and top surfaces, along a second output axis that is inclined with respect to the first axis at a non-zero angle.

31. A method according to claim 22, further comprising
with an optical detector unit, receiving light resulting from a spatial overlap between the first output measurement beam and a corresponding first output reference beam, the first output reference beam having been formed from a second portion of light delivered to the encoder head of said exposure tool, and
with a programmable computer processor, determining phase information characterizing interference between said first output measurement beam and said first output reference beam, the phase information representing said position of the target.

32. An optical system configured to reflect an input beam of light to form a reflected beam of light, the optical system comprising:
- an optical surface, and
- a combination of
  - an optically-isotropic block having rectangular facets including an input facet, an output facet opposite to the input facet, and multiple side facets connecting the input and output facets, and
  - first and second optically-isotropic wedge elements disposed between said block and said optical surface along the output facet such as to not intersect an axis of symmetry of said input facet, and symmetrically with respect to said axis of symmetry, wherein said axis of symmetry is perpendicular to the input facet,
- wherein the optical surface is disposed to redirect a portion of said input beam, that has entered said block through the input facet and traversed said block, towards an optical wedge element from the first and second wedge elements to traverse first said optical wedge element and then the output facet,
- wherein the input facet forms a right dihedral angle with each of the side facets and each of the side facets forms a right dihedral angle with each of neighboring side facets,
- wherein the combination and the optical surface are mutually oriented such that an optical beam, formed by said portion that has been redirected by the optical surface:
  a) is first transmitted through the first wedge element and through the output surface,
  b) is then retroreflected internally in said optical block, and
  c) is further redirected by said optical surface through the second wedge element, through the output surface, and through the input surface to form said reflected beam,
- wherein the reflected beam is inclined at a non-zero angle with respect to the input beam.

33. The optical system according to claim 32,
- wherein the optical surface includes a two-dimensional (2D) diffraction grating, and
- wherein the optical system includes four optically-isotropic wedges disposed along the output facet such that a thick end of each of said four optically-isotropic wedges is closer to a center of the output facet than a thin end of each of said wedges.

* * * * *